(12) United States Patent
Ihren

(10) Patent No.: US 12,197,135 B2
(45) Date of Patent: Jan. 14, 2025

(54) DEVICE AND METHOD FOR SETTING RELATIVE LASER INTENSITIES

(71) Applicant: Mycronic AB, Taby (SE)

(72) Inventor: Fredric Ihren, Taby (SE)

(73) Assignee: Mycronic AB, Taby (SE)

( * ) Notice: Subject to any disclaimer, the term of this patent is extended or adjusted under 35 U.S.C. 154(b) by 76 days.

(21) Appl. No.: 18/042,256

(22) PCT Filed: Oct. 18, 2021

(86) PCT No.: PCT/EP2021/078795
§ 371 (c)(1),
(2) Date: Feb. 20, 2023

(87) PCT Pub. No.: WO2022/084243
PCT Pub. Date: Apr. 28, 2022

(65) Prior Publication Data
US 2023/0333484 A1    Oct. 19, 2023

(30) Foreign Application Priority Data
Oct. 20, 2020   (EP) .................................. 20202790

(51) Int. Cl.
*G03F 7/00* (2006.01)
*G03F 1/76* (2012.01)

(52) U.S. Cl.
CPC ............ *G03F 7/70558* (2013.01); *G03F 1/76* (2013.01); *G03F 7/70191* (2013.01)

(58) Field of Classification Search
CPC .... G03F 7/70558; G03F 1/76; G03F 7/70191; G03F 1/68; G03F 7/70383; G03F 7/70508
See application file for complete search history.

(56) References Cited

U.S. PATENT DOCUMENTS 7,034,963 B2 *   4/2006   Klatchko ............. H04N 1/4092
                                                             358/1.9
9,405,203 B2 *   8/2016   Chen ................... G03F 7/70508
(Continued)

OTHER PUBLICATIONS

International Search Report for International Application No. PCT/EP2021/078795 dated Jan. 5, 2022.

*Primary Examiner* — Hung V Nguyen
(74) *Attorney, Agent, or Firm* — Harness, Dickey & Pierce, P.L.C.

(57) ABSTRACT

A method setting respective relative laser intensities to a plurality of pixels representing a lithographic exposure includes: decreasing a relative laser intensity of each pixel from a respective first relative laser intensity to a respective second relative laser intensity, adjusting a laser dose translation of relative laser intensity of pixels from a first laser dose translation of the first relative laser intensity to a second laser dose translation of the second relative laser intensity, such that a respective effective exposed laser dose of each pixel achieved by the second laser dose translation is equal to a respective effective exposed laser dose of each pixel that would have resulted from the first laser dose translation, and increasing, by a constant additive term, the respective relative laser intensity of an edge pixel or of a neighbouring pixel from the respective second relative laser intensity to a respective third relative laser intensity.

10 Claims, 4 Drawing Sheets

(56) References Cited

U.S. PATENT DOCUMENTS

| | | | |
|---|---|---|---|
| 10,444,629 B2* | 10/2019 | Zable | G03F 1/78 |
| 11,099,482 B2* | 8/2021 | Hochleitner | H01J 37/3177 |
| 11,567,413 B2* | 1/2023 | Wang | G06T 7/001 |
| 2006/0001688 A1 | 1/2006 | Chabreck et al. | |
| 2014/0192334 A1 | 7/2014 | Chen et al. | |
| 2020/0012195 A1 | 1/2020 | Zable | |

* cited by examiner

DEVICE AND METHOD FOR SETTING RELATIVE LASER INTENSITIES

CROSS-REFERENCE TO RELATED APPLICATIONS

This application is a national phase under 35 U.S.C. § 371 of PCT International Application No. PCT/EP2021/078795 which has an International filing date of Oct. 18, 2021, which claims priority to European Application No. 20202790.0, filed Oct. 20, 2020, the entire contents of each of which are hereby incorporated by reference.

TECHNICAL FIELD

The present disclosure relates to pattern generation, and specifically to method for setting respective relative laser intensities to a plurality of pixels representing a lithographic exposure.

BACKGROUND

In the area of pattern generation, such as in mask printing, a pattern to be printed is typically translated in relation to a plurality (grid) of pixels and a respective relative laser intensity is set for each pixel of the plurality of pixels proportional to the area of the pixel covered by the pattern to be printed. For some pixels of the plurality of pixels, all of their respective areas are covered by the pattern and hence, a respective relative laser intensity of 100 percent is set. For some pixels of the plurality of pixels (at an edge of the pattern), only a portion of their respective areas are covered by the pattern to and hence a respective relative laser intensity proportional to the respective area covered (and hence lower than 100 percent) is set. For example, if 50% of the area of a pixel covered by the pattern, this will result in setting a 50% relative laser intensity for that pixel. A problem with prior art pattern generators is that edge sharpness and edge roughness of a printed pattern sometimes become unsatisfactory.

SUMMARY

The inventor has realised that the problem with prior art that edge sharpness and edge roughness of a printed pattern becomes unsatisfactory depends on the relative laser intensity of pixels at or close to an edge of the pattern. The edge of the pattern is a border between where pixels are exposed to some degree, i.e. with a relative laser intensity higher than 0%, and where pixels are not exposed at all, i.e. with a relative laser intensity equal to 0%.

According to a first aspect a method for setting respective relative laser intensities to a plurality of pixels representing a lithographic exposure is provided. The plurality of pixels comprises at least one edge pixel arranged at an edge of an area of pixels to be exposed, and at least one neighbouring pixel. The at least one neighbouring pixel is arranged one pixel away from the at least one edge pixel in a perpendicular direction away from the edge towards the area of pixels to be exposed. The method comprises decreasing proportionally a relative laser intensity of each pixel of the plurality of pixels from a previously set respective first relative laser intensity to a respective second relative laser intensity. A laser dose translation of relative laser intensity of pixels is adjusted proportionally from a previously set first laser dose translation of the first relative laser intensity to a second laser dose translation of the second relative laser intensity. The proportional adjustment is such that a respective effective exposed laser dose of each pixel is achieved by the second laser dose translation of the respective second relative laser intensity which is equal to a respective effective exposed laser dose of each pixel that would have resulted from the first laser dose translation of the respective first relative laser intensity. The respective relative laser intensity of an edge pixel of the at least one edge pixel or of a neighbouring pixel of the at least one neighbouring pixel is increased by a constant additive term from the respective second relative laser intensity to a respective third relative laser intensity.

By decreasing proportionally first the relative laser intensity of each pixel and then adjusting proportionally a laser dose translation such that an effective exposed laser dose of each pixel is the same as if there had been no proportional decrease of relative laser intensity and proportional adjustment of laser dose translation, the highest relative laser intensity is effectively lowered to less than 100% relative laser intensity. This accommodates for an increase of relative laser intensity for pixels regardless of their original (first) relative laser intensity. Thus, the respective relative laser intensity of an edge pixel or of a neighbouring pixel may be increased by the constant additive term which enables an enhancement of edge sharpness and edge roughness.

Relative laser intensity is a way of indicating a laser intensity in relation to pixels and may for example be defined by 100% relative laser intensity corresponding to a laser intensity selected to achieve a desired exposure over adjacent pixels for which 100% of the area of the pixel should be exposed according to the pattern.

The previously set respective first relative laser intensity of each pixel and the previously set first laser dose translation have been previously selected (calibrated) such that the previously set first laser dose translation of a previously set first relative laser intensity of 100% laser intensity will result in 100% exposure, where 100% exposure is the effective exposed laser dose which has been calibrated to give a desired constant exposure over adjacent pixels for which 100% of the area of the pixels should be exposed according to the pattern.

An edge pixel may be defined as a pixel for which the respective first relative laser intensity is larger than 0 percent relative laser intensity, and that is adjacently arranged to at least one pixel for which the respective first relative laser intensity is 0 percent relative laser intensity.

A neighbouring pixel may be defined as a pixel for which the respective first relative laser intensity is larger than 0 percent relative laser intensity, and that is adjacently arranged to an edge pixel in a direction perpendicular from the edge.

The respective second relative laser intensity may be equal to the respective first relative laser intensity multiplied by a factor less than one. In other words, the respective second relative laser intensity of each pixel of the plurality of pixels is the respective first relative laser intensity multiplied by the factor less than one.

The inventor has further realised that a laser intensity higher than what 100 percent relative laser intensity translates into by means of the first laser dose translation in respect to the respective first relative laser intensity will enhance edge sharpness and edge roughness when achieved for edge pixels in some situations and for neighbouring pixels in some situations will enhance. Thus, the respective third relative laser intensity may be configured such that a respective effective exposed laser dose achieved by the second laser dose translation of the respective third relative laser intensity of the edge pixel of the at least one edge pixel or of the neighbouring pixel of the at least one neighbouring pixel is larger than a respective effective exposed laser dose achieved by the first laser dose translation of 100 percent relative laser intensity in respect to the respective first relative laser intensity. This means that the edge pixel or the neighbouring pixel will have an effective exposed laser dose higher than the one for pixels of the plurality of pixels that are completely covered by the pattern and hence should have 100 percent relative laser intensity according to the respective first relative laser intensity.

The method may further comprise conditions based on which increase by the constant additive term is made in relation to the edge pixel of the at least one edge pixel or to the neighbouring pixel of the at least one neighbouring pixel. For example, a threshold may be introduced such that, on condition that the respective relative laser intensity of the edge pixel of the at least one edge pixel corresponds to a relative laser intensity larger than the threshold, the respective second relative laser intensity of the edge pixel of the at least one edge pixel is increased by the constant additive term to the respective third relative laser intensity. On the other hand, on condition that the respective relative laser intensity of the edge pixel of the at least one edge pixel corresponds to a relative laser intensity less than the threshold, the respective second relative laser intensity of the neighbouring pixel of the at least one neighbouring pixel is increased by the constant additive term to the respective third relative laser intensity.

The respective first relative laser intensity may correspond to a respective percentage from 0 to 100 percent relative laser intensity. Consequently, the respective second relative laser intensity will correspond to a respective percentage from 0 to a percentage less than 100 percent relative laser intensity since the respective second relative laser intensity corresponds to a decrease from the respective first relative laser intensity.

According to a second aspect, a computer readable media is provided having stored thereon a computer program comprising computer readable instructions that, when executed on a processing device, cause the processing means to perform the method of the first aspect.

The computer readable media of the second aspect may further include additional features corresponding to the additional features described in relation to the method of the first aspect.

The computer readable media of the second aspect may for example be a non-transitory computer readable media.

According to a third aspect, a computer program is provided comprising computer readable instructions that, when executed on a processing device, cause the processing device to perform the method of the first aspect.

The computer program of the third aspect may further include additional features corresponding to the additional features described in relation to the method of the first aspect.

According to a fourth aspect, a device for setting respective relative laser intensities to a plurality of pixels is provided. The plurality of pixels comprises at least one edge pixel, and at least one neighbouring pixel, wherein the at least one neighbouring pixel is arranged one pixel away from the at least one edge pixel in a perpendicular direction from an edge. The device comprises processing means configured to perform the method of the first aspect.

The device of the fourth aspect may further include additional features corresponding to the additional features described in relation to the method of the first aspect.

According to a fifth aspect, a mask writer system comprising the device according to the fourth aspect is provided.

The mask writer system of the fifth aspect may further include additional features corresponding to the additional features described in relation to the device of the fourth aspect.

According to a sixth aspect, a method for setting effective exposed laser dose of a plurality of pixels representing a lithographic exposure is provided. The plurality of pixels comprises at least one edge pixel, at least one neighbouring pixel arranged one pixel away from the at least one edge pixel in a perpendicular direction away from an edge, and a non-neighbouring pixel arranged at least pixels away from the at least one edge pixel in the perpendicular direction away from the edge. The method comprises setting a respective effective exposed laser dose of each pixel of the plurality of pixels such that a respective effective exposed laser dose of an edge pixel of the at least one edge pixel or of a neighbouring pixel of the at least one neighbouring pixel is higher than a respective effective exposed laser dose of the non-neighbouring pixel.

BRIEF DESCRIPTION OF THE DRAWINGS

Examples will be described below with reference to the accompanying drawings in which.

All the figures are schematic and generally only show parts which are necessary in order to elucidate the respective examples, whereas other parts may be omitted or merely suggested.

DETAILED DESCRIPTION

The method and device of the present disclosure may advantageously be implemented in a pattern generator for printing a pattern onto a photo-sensitive resist.

Figure 1:
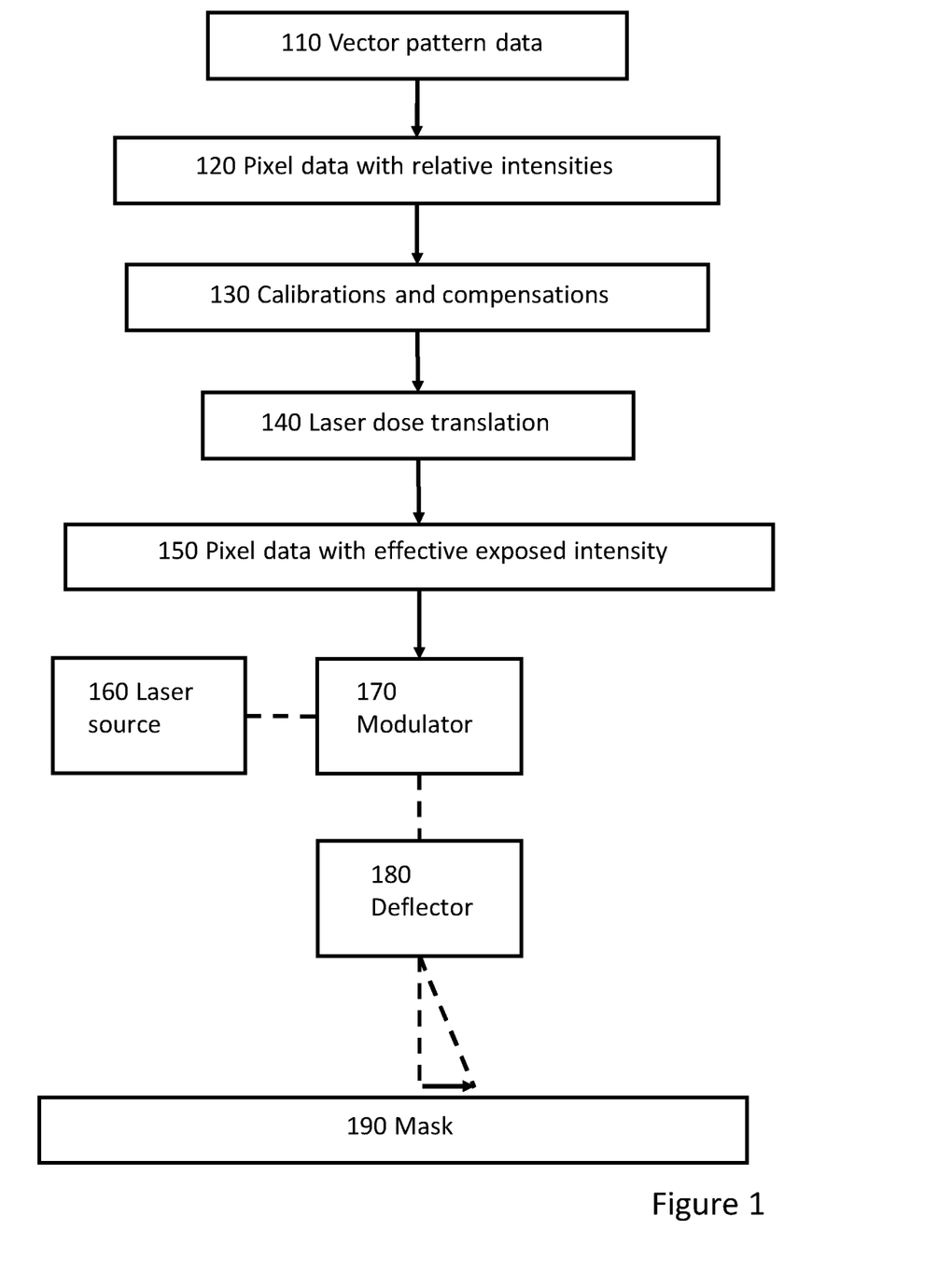
FIG. 1 shows a schematic diagram of setting respective relative laser intensities to a plurality of pixels representing a lithographic exposure according to the present disclosure in relation to a mask writing system according to prior art.

FIG. 1 shows a schematic diagram of setting respective effective exposed laser intensities to a plurality of pixels representing a lithographic exposure in relation to a mask writing system (lithographic exposure system) according to prior art. A block 110 represents obtaining of an original pattern description, e.g. in the form of vector pattern data which are pattern data for mask exposure in the form of vector data (geometrical figures specified by coordinates) in an ideal coordinate system. The vector pattern data are then used in rasterization in a block 120 to produce pixel data with relative intensities which simplified can be said to be done by examining area coverage of the vector data in each pixel. The respective relative laser intensity of each pixel is then proportional to a portion of the area of the pixel that is covered by the vector pattern data. For a pixel which is completely covered by the vector pattern data, a respective relative laser intensity of 100% is set. For a pixel at an edge of the pattern covered only to portion, say 50%, by the vector pattern data, a respective relative laser intensity of 50% is set. An area of a pixel being covered by the pattern here means that the area corresponds to an area of the pattern which is to be exposed.

In a block 130 the linear area coverage pixel data is then calibrated for a non-linear response of the exposure and chemical image development. Compensation is also made for various aspects of pixel intensity and size over the exposure beams and sweep directions. In a block 140 the respective relative laser intensities for the pixels are proportionally translated to respective effective exposed laser intensities for the pixels. The respective effective exposed laser intensities for the pixels are calibrated to give a right amount of light to give a homogeneous exposed level on neighbouring fully exposed pixels given the current intensity from the laser light source and optics.

In a block 150 the respective effective exposed laser intensities for the pixels are then provided to a mask writing system (lithographic exposure system). The mask writing system comprises a laser source 160, a modulator 170, and a deflector 180. The respective exposed laser intensities for the pixels are used the modulator 170 to modulate a laser beam from the laser source 160. The modulated laser beam is projected by means of the deflector 180 onto a photo sensitive resist (mask) 190 in order to expose the photo sensitive resist according to a desired pattern, i.e. providing the respective effective exposed laser intensity/dose. Additional components such as optics (not shown) are included in the mask writing system between the laser source 160 and the modulator 170, between the modulator 170 and the deflector 180, and between the deflector 180 and the mask 190.

The inventor has realised that an edge sharpness and edge roughness of a printed pattern depends on the relative laser intensity of pixels at an edge or close to an edge of the pattern. The edge of the pattern is a border between where pixels are exposed to some degree, i.e. with a relative laser intensity higher than 0%, and where pixels are not exposed at all, i.e. with a relative laser intensity equal to 0%. For example, edge sharpness and edge roughness will be negatively affected by relative laser intensities of edge pixels set within certain percentages. Relative laser intensities close to 100%, such as for example 80% and above will result in satisfactory properties of edge sharpness and edge roughness. This is due to the relative laser intensity of the edge pixel is close enough to 100% to provide satisfactory properties in relation to edge sharpness and edge roughness. Similarly, relative laser intensities close to 0%, such as 20% and below will result in satisfactory properties in relation to edge sharpness and edge roughness. This is due to the relative laser intensity of the edge pixel is so small in relation to the relative laser intensity of 100% of the neighbouring pixel for the neighbouring pixels relative laser intensity dominating the appearance of the edge in terms of edge sharpness and edge roughness. In contrast to this, relative laser intensities closer to 50% will generally result in unsatisfactory properties of edge sharpness and edge roughness. Edge sharpness and edge roughness of a printed pattern can be enhanced by increasing a relative laser intensity of an edge pixel or of a neighbouring pixel. An edge pixel is a pixel for which the respective relative laser intensity is larger than 0% relative laser intensity, and that is adjacently arranged to at least one pixel for which the respective first relative laser intensity is 0% relative laser intensity. In other words, an edge pixel is a pixel that is to be exposed and that is adjacent to a pixel that is not to be exposed. The edge pixel is arranged at an edge of an area of pixels (area including pixels) to be exposed. A neighbouring pixel is a pixel for which the respective relative laser intensity is larger than 0% relative laser intensity, and that is adjacently arranged to an edge pixel in a direction perpendicular from the edge towards the area of pixels to be exposed. In other words, a neighbouring pixel is a pixel that is to be exposed and that is adjacent to an edge pixel in the opposite direction from the pixel that is adjacent to the edge pixel and that is not to be exposed.

Figure 2:
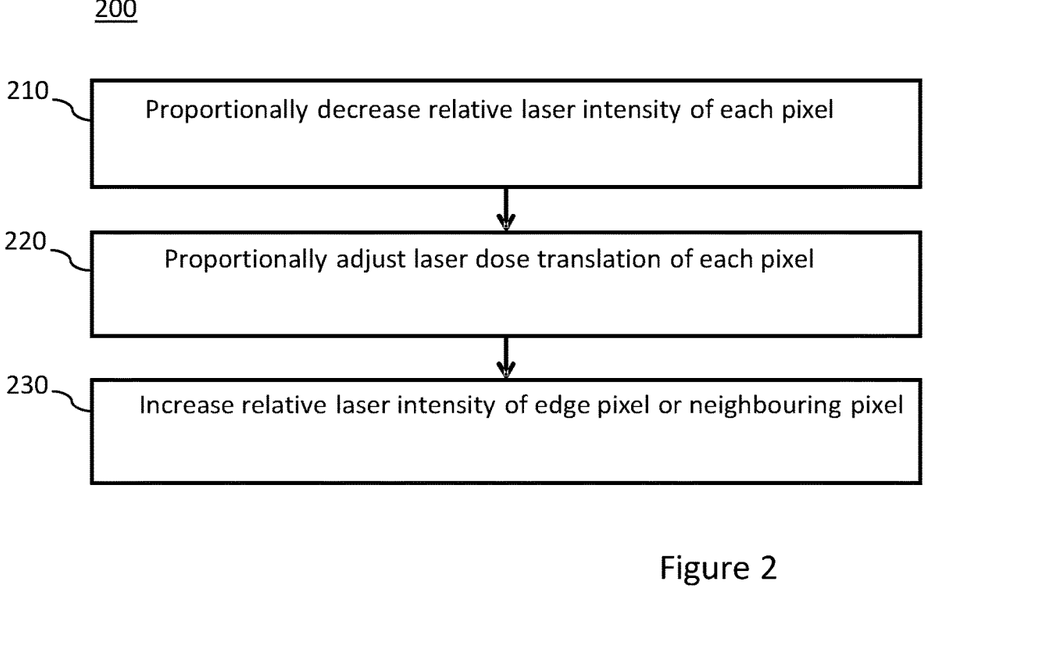
FIG. 2 shows a flow chart of an example of a method according to the present disclosure.

FIG. 2 shows a flow chart of an example of a method 200 for setting respective relative laser intensities to a plurality of pixels representing a lithographic exposure according to the present disclosure. The plurality of pixels comprises at least one edge pixel, and at least one neighbouring pixel. The relative laser intensity of each pixel of the plurality of pixels previously set respective first relative laser intensity. This may typically have been done in relation to rasterization of an original pattern description into respective relative laser intensities for the plurality of pixels and.

The method 200 comprises proportionally decreasing 210 a relative laser intensity of each pixel of the plurality of pixels from a previously set respective first relative laser intensity to a respective second relative laser intensity. For example, the respective first laser intensity of each pixel of the plurality of pixels may be multiplied by a factor less than one. If for example, the factor is 0.8, a pixel having a respective first relative laser intensity of 100% will have a respective second relative laser intensity of 80%.

In relation to FIG. 1, the decreasing 210 of the relative laser intensity is performed in relation to block 120 (before block 130).

The method 200 further comprises proportionally adjusting 220 a laser dose translation of relative laser intensity of pixels from a previously set first laser dose translation to a second laser dose translation. The proportional adjustment is such that a respective effective exposed laser dose of each pixel of the plurality of pixels is achieved by the second laser dose translation of the respective second relative laser intensity which is equal to a respective effective exposed laser dose of each pixel of the plurality of pixels that would have resulted from the first laser dose translation of the respective first relative laser intensity. If for example, the factor is 0.8, a pixel having a respective first relative laser intensity of 100% will have a respective second relative laser intensity of 80% and using the second laser dose translation, the effective exposed laser dose would be the same for the pixel now having the second relative laser intensity of 80% as the effective exposed laser dose for the pixel having the first relative laser intensity of 100% using the first laser dose translation.

In relation to FIG. 1, the proportional adjusting 220 the laser dose translation is performed in relation to block 140 (before block 150).

The proportional decrease of relative laser intensities and the proportional adjustment of the laser dose translation will result in an unchanged effective exposed laser dose of each pixel of the plurality of pixels, but the set relative laser intensities will all have been decreased.

The method 200 further comprises increasing 230 the respective relative laser intensity of an edge pixel of the at least one edge pixel or of a neighbouring pixel of the at least one neighbouring pixel from the respective second relative laser intensity to a respective third relative laser intensity. The increase may for example be by addition of a constant term.

The respective third relative laser intensity may be configured such that a respective effective exposed laser dose achieved by the second laser dose translation of the respective third relative laser intensity of the edge pixel of the at least one edge pixel or of the neighbouring pixel of the at least one neighbouring pixel is higher than a respective effective exposed laser dose achieved by the first laser dose translation of 100% relative laser intensity in respect to the respective first relative laser intensity. This means that the edge pixel or the neighbouring pixel will have an effective exposed laser dose higher than the one for pixels of the plurality of pixels that are completely covered by the pattern and hence should have 100% relative laser intensity according to the respective first relative laser intensity. This is possible to achieve since the proportional decrease of relative laser intensities and the proportional adjustment of the laser dose translation will result in an unchanged effective exposed laser dose of each pixel of the plurality of pixels, but the set relative laser intensities will all have been decreased. For example, the respective third laser intensity may be 100% relative laser intensity. Using the second laser dose translation, this will be translated into a higher effective exposed laser dose than a respective effective exposed laser dose achieved by the first laser dose translation of 100% relative laser intensity in respect to the respective first relative laser intensity. This is because the respective effective exposed laser dose achieved by the first laser dose translation of 100% relative laser intensity in respect to the respective first relative laser intensity is equal to the respective effective exposed laser dose achieved by a second laser dose translation of less than 100% relative laser intensity in respect to the respective second relative laser intensity.

In relation to FIG. 1, the increasing 230 the respective relative laser intensity of an edge pixel of the at least one edge pixel or of a neighbouring pixel of the at least one neighbouring pixel is performed in relation to block 120 (before block 130).

Whether the constant term is added to the edge pixel or the neighbouring pixel may be determined based on one or more thresholds. For example, if one threshold used, say for example 40%, the constant additive term is added to the respective second relative laser intensity of the edge pixel of the at least one edge pixel to the respective third relative laser intensity on condition that the respective relative laser intensity of the edge pixel of the at least one edge pixel corresponds to a relative laser intensity larger than the threshold.

On condition that the respective relative laser intensity of the edge pixel of the at least one edge pixel corresponds to a relative laser intensity less than the threshold, the respective second relative laser intensity of the neighbouring pixel of the at least one neighbouring pixel is increased, by the constant additive term, to the respective third relative laser intensity. The neighbouring pixel here is the neighbouring pixel corresponding to the edge pixel having the relative laser intensity less than the threshold. The threshold is preferably set in relation a respective first relative laser intensity which provides unsatisfactory properties in relation edge sharpness and edge roughness. For example, such a threshold may be set to 50% in relation to the respective first relative laser intensity, which for a factor of 0.8 would correspond to 40% in relation to the respective second relative laser intensity. In relation to FIG. 1, the pixel data with effective exposed laser dose provided by the method 200 includes unaffected effective exposed laser dose for all pixels which are not edge pixels or neighbouring pixels. Generally, to translate the vector pattern data into effective exposed laser dose for pattern printing non-linearities have to be taken into account and includes complex calibration and compensations. The edge pixels or neighbouring pixels will receive a higher effective exposed laser dose. The transform in the method 200 is applied to the relative laser intensity (e.g. by multiplication by a factor less than 1) for which the intensity is still linear in relation to exposed area. Furthermore, the laser dose translation is non-linearly calibrated and compensated but the level of the laser dose translation can be adjusted to provide unaffected effective exposed laser dose for all pixels which should be fully exposed. Hence, adjustments of the blocks 120 and 140 of FIG. 1 in accordance with the method 200 of FIG. 2 can be made independently from the block 130 of FIG. 1.

An implementation of the method of the present disclosure will now be described in relation to FIGS. 3a-d. FIGS. 3a-d show illustrations in relation to a portion of a pattern to be printed on a photo-sensitive resist and 36 pixels in relation to the photo-sensitive resist. For purpose of description, the pixels are designated in relation to six columns A-F and six rows 1-6, such that the upper left pixel is designated pixel A1, next pixel to the right is designated to as pixel B1, etc. to F6.

It is to be noted that FIGS. 3a-d are only provided illustrate example principles for printing a pattern onto a photo-sensitive resist. The number of pixels and relative dimensions of the pixels and the resulting pattern are not intended to reflect a real result but rather a few pixels and a portion of a pattern which typically is much larger.

Figure 3A:
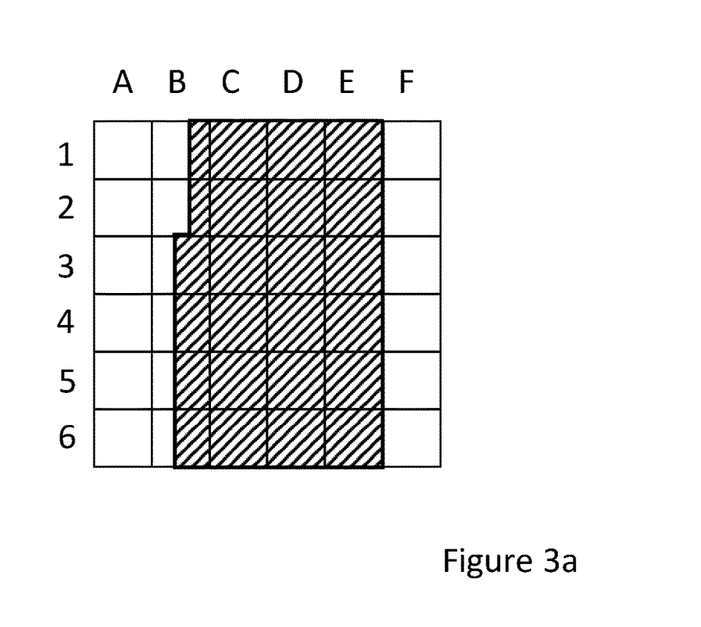
FIGS. 3a-d show illustrations of a portion of a pattern to be printed on a photo-sensitive resist in relation to implementation of the method and the device of the present disclosure.

In FIG. 3a, a portion of a pattern indicated as a diagonally striped area in relation to the 36 pixels A1 to F6. All pixels in columns C, D and E are completely covered by the pattern, and the pixels in the columns A and F are outside the pattern. The pixels in column B are partly covered by the pattern such that the first two pixels B1 and B2 are covered to 40% and the following four pixels B3, B4, B5 and B6 are covered to 60%. It is to be noted that FIG. 3a is only for illustrational purpose to show how much of the different pixels are covered.

Figure 3B:
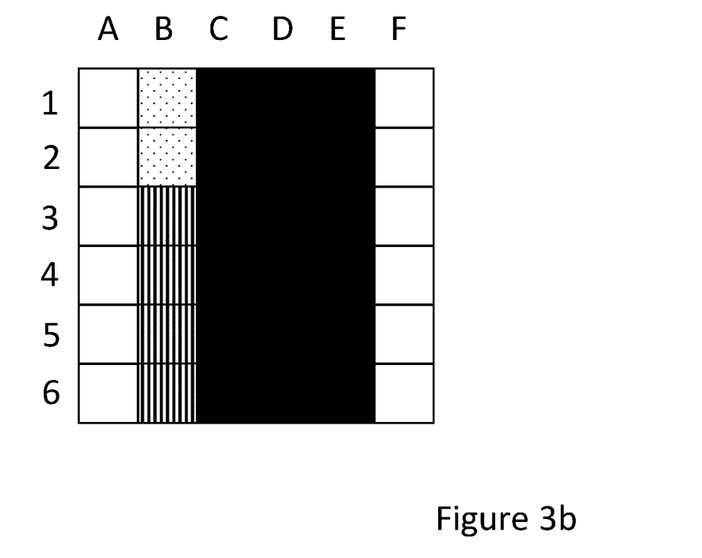

In prior art, pattern generators have been calibrated to produce a relative intensity of the laser for each pixel proportional to the relative area, i.e. the percentage of the area, of the pixel that is determined to be covered by the pattern, the relative intensity of the laser for that pixel is set to that certain percentage. Turning to FIG. 3b, this is shown in relation to the portion of the pattern illustrated in FIG. 3a. For the pixels in columns C, D and F which are covered to 100% by the pattern, 100% relative laser intensity is set as a respective first relative laser intensity for those pixels. This is illustrated by the pixels being indicated as black representing 100% relative laser intensity. For the two pixels B1 and B2 from the top of column B which are covered to 40% by the pattern, 40% relative laser intensity is set as a respective first relative laser intensity for those pixels. This is illustrated by the pixels being are indicated with black dots on a white background representing 40% relative laser intensity. For the following four pixels B3, B4, B5, and B6 of column B which are covered to 60% by the pattern, 60% relative laser intensity is set as a respective first relative laser intensity for those pixels. This is illustrated by the pixels being indicated with black vertical stripes on a white background representing 60% relative laser intensity.

Figure 3C:
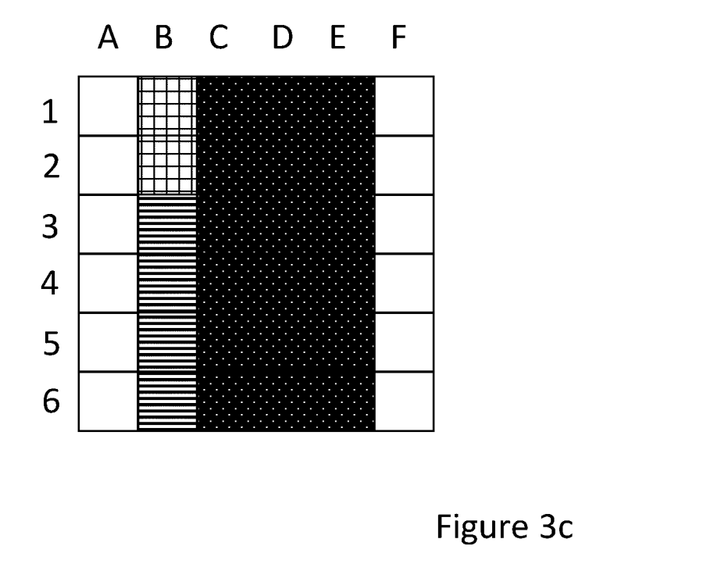

As both the pixels B1 and B2 having a respective first relative laser intensity of 40% and the pixels B3, B4, B5 and B6 having a respective first relative laser intensity of 60% are in the middle range close to 50% the properties of edge sharpness and edge roughness of the printed pattern will be unfavourable. In order to enhance the properties of edge sharpness and edge roughness of the printed pattern, the method according to the present disclosure, e.g. such as described in relation to FIG. 1, can be used. Starting then with proportionally decreasing the relative laser intensity of each pixel of the pixels from the respective first relative laser intensity to a respective second relative laser intensity. In relation to FIG. 3b, the respective first laser intensity of each pixel of the plurality of pixels may be multiplied by a factor 0.8. Hence, the pixels in columns C, D and E having the respective first relative laser intensity of 100% will have a respective second relative laser intensity of 80%. This is illustrated in FIG. 3c by the pixels being indicated as white dots on a black background representing 80% relative laser intensity. The two pixels B1 and B2 from the top of column B having the respective first relative laser intensity of 40% will have a respective second relative laser intensity of 32%. This is illustrated in FIG. 3c by the pixels being indicated as black grid on a white background representing 32% relative laser intensity. The following four pixels B3, B4, B5, and B6 of column B having the respective first relative laser intensity of 60% will have a respective second relative laser intensity of 48%. This is illustrated in FIG. 3c by the pixels being indicated as black horizontal lines representing 48% relative laser intensity.

The decrease of relative laser intensities as illustrated in FIG. 3c is then combined with proportionally adjusting a laser dose translation of relative laser intensity of pixels from a previously set first laser dose translation to a second laser dose translation. The proportional adjustment is such that a respective effective exposed laser dose of each pixel of the plurality of pixels is achieved by the second laser dose translation of the respective second relative laser intensity which is equal to a respective effective exposed laser dose of each pixel of the plurality of pixels that would have resulted from the first laser dose translation of the respective first relative laser intensity.

The proportional decrease of relative laser intensities and the proportional adjustment of the laser dose translation will result in an unchanged effective exposed laser dose of each pixel of the of pixels, but the set relative laser intensities will all have been decreased. What this does however is that it accommodates for an individual increase of the relative laser intensity in relation to all pixels as all pixels will now have a respective second relative laser intensity which is 80% or lower.

In order to enhance the properties of edge sharpness and edge roughness of the printed pattern the relative laser intensity of an edge pixel of the at least one edge pixel or of a neighbouring pixel of the at least one neighbouring pixel may be increased from the respective second relative laser intensity to a respective third relative laser intensity. The increase may for example be by addition of a constant term.

Figure 3D:
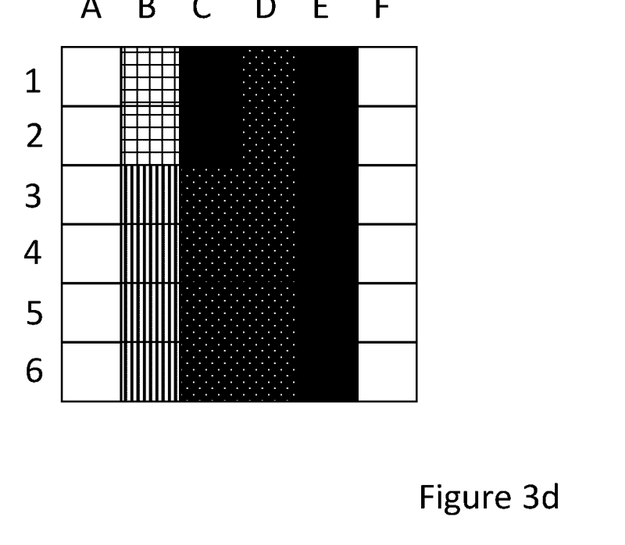

In FIG. 3d respective relative laser intensities for the pixels are illustrated after increasing the relative laser intensity for some of the pixels. For example, in column E, the relative laser intensity of pixels E1, E2, E3, E4, E5, and E6, which are edge pixels, have been increased by addition of a constant additive term corresponding to 20% relative laser intensity to the respective second relative laser intensity of 80% resulting in a respective third relative laser intensity of 100%. This is illustrated in FIG. 3d by the pixels E1, E2, E3, E4, E5, and E6 being indicated as black representing 100% relative laser intensity. This means that the edge pixels E1, E2, E3, E4, E5, and E6 of column E will have an effective exposed laser dose higher than the one for pixels D1, D2, D3, D4, D5, and D6, of column D which had 100% relative laser intensity according to the respective first relative laser intensity. This is because the respective effective exposed laser dose achieved by the first laser dose translation of 100% relative laser intensity in respect to the respective first relative laser intensity is equal to the respective effective exposed laser dose achieved by a second laser dose translation of less than 100% relative laser intensity in respect to the respective second relative laser intensity.

Generally, increasing the effective exposed laser dose, e.g. by increasing the relative laser intensity, of an edge pixel such that it is higher than the effective exposed laser dose for a pixel which had 100% relative laser intensity according to the respective first relative laser intensity will enhance the properties of edge sharpness and edge roughness of the printed pattern in relation to that edge pixel. Such an increase could be referred to as providing an overdose in relation to the edge pixel.

Whether the constant term is added to the edge pixel or the neighbouring pixel may be determined based on one or more thresholds. For example, in relation to FIG. 3b the threshold 40% is used in relation to the respective relative laser intensity, which corresponds to 50% in relation to the respective first relative laser intensity. For edge pixels with the respective second relative laser intensity above the threshold 40%, the constant additive term is added to the respective second relative laser intensity of the edge pixel and for edge pixels with the respective second relative laser intensity below 40%, the constant additive term is added to the respective second relative laser intensity of the neighbouring pixel of the edge pixel.

The two pixels B1 and B2 from the top of column B having the respective second relative laser intensity of 32% as illustrated in FIG. 3c by the pixels being indicated as black grid on a white background. This is below the threshold 40% and the constant additive term is added to the respective second relative laser intensity of the neighbouring pixels C1 and C2, respectively, of the edge pixels B1 and B2. In this case the constant additive term corresponding to 20% relative laser intensity is added to the respective second relative laser intensity of 80% of the neighbouring pixels C1 and C2, respectively, thereby resulting in a respective third relative laser intensity of 100% for the two neighbouring pixels C1 and C2. This is illustrated in FIG. 3d by the pixels C1 and C2 being indicated as black representing 100% relative laser intensity. This means that the neighbouring pixels C1 and C2 each will have an effective exposed laser dose higher than the one for pixels D1 and D2 of column D which had 100% relative laser intensity according to the respective first relative laser intensity.

Generally, increasing the relative laser intensity of a neighbouring pixel by addition of the constant additive term whilst maintaining the respective relative laser intensity of the corresponding edge pixel will enhance the properties of edge sharpness and edge roughness of the printed pattern in relation to a corresponding edge pixel when the corresponding edge pixel has a respective first relative laser intensity in a lower part of a middle range around 50%, such as for example 50% or lower, since this will effectively reduce the relative laser intensity of the edge pixel in relation to the relative laser intensity of the neighbouring pixel. Hence, the neighbouring pixels relative laser intensity will dominate the appearance of the edge more which will enhance the properties of the edge in terms of edge sharpness and edge roughness.

The following four pixels B3, B4, B5, and B6 of column B having the respective first relative laser intensity of 60% will have a respective second relative laser intensity of 48%.

This is illustrated in FIG. 3c by the pixels being indicated as black horizontal lines representing 48% relative laser intensity. This is above the threshold 40% and the constant additive term is added to the respective second relative laser intensity of the edge pixels B3, B4, B5, and B6, respectively. In this case the constant additive term corresponding to 20% relative laser intensity is added to the respective second relative laser intensity of 48% of the edge pixels B3, B4, B5 and B6, respectively, thereby resulting in a respective third relative laser intensity of 68% for the two edge pixels B3, B4, B5 and B6. This is illustrated in FIG. 3d by the edge pixels B3, B4, B5 and B6 being indicated by black vertical stripes on a white background representing 68% relative laser intensity. This means that the edge pixels B3, B4, B5 and B6 each will have an effective exposed laser dose higher than they would have had based on their respective first relative laser intensity and first laser dose translation.

Generally, increasing the effective exposed laser dose of an edge pixel, e.g. by addition of the constant additive term to the respective second relative laser intensity, will enhance the properties of edge sharpness and edge roughness of the printed pattern in relation to the edge pixel when the corresponding edge pixel has a respective first relative laser intensity in the upper portion of a middle range around 50%, such as for example 50% or higher. This is because the increased effective exposed laser dose will correspond to an effective exposed laser dose resulting from a respective first relative laser dose and the first dose translation, which respective first relative laser dose is closer to the higher range, say 80-100% for which satisfactory properties in relation to edge sharpness and edge roughness result.

The pixels C3, C4, C5, and C6 of column C, and the pixels D1, D2, D3, D4, D5 and D6 of column D are unchanged in terms of respective relative laser intensity. This is illustrated in FIG. 3d by the pixels being indicated by white dots on a black background representing 80% relative laser intensity which is the same as in FIG. 3c.

Figure 4:
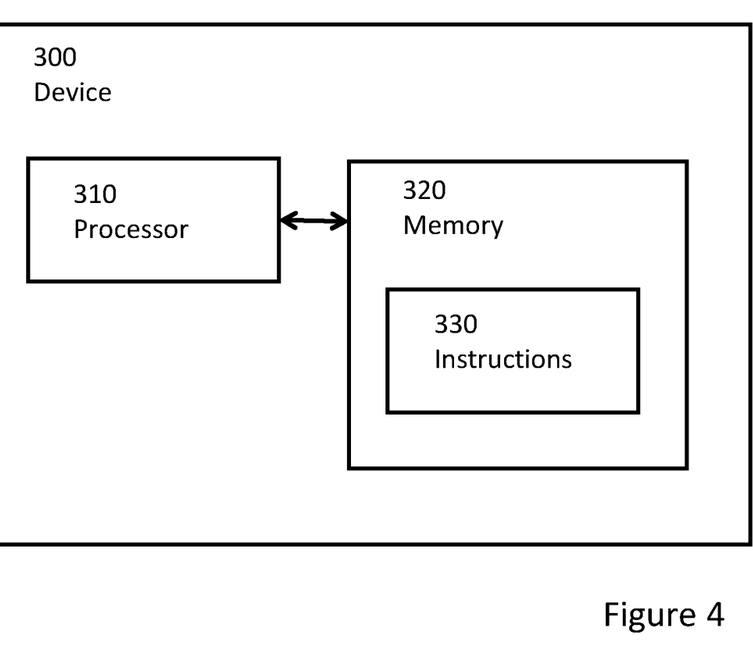
FIG. 4 shows a schematic diagram of an example of a device according to the present disclosure.

FIG. 4 shows a schematic diagram of an example of a device 400 or setting respective relative laser intensities to a plurality of pixels according to the present disclosure. The plurality of pixels comprises at least one edge pixel, and at least one neighbouring pixel, wherein the at least one neighbouring pixel is arranged one pixel away from to the at least one edge pixel in a perpendicular direction from an edge. The device comprising processing means configured to perform the method of the present disclosure, such as the method described in relation to FIG. 1 and FIGS. 3a-d. The processing means, may for example a processor 410 comprised in the device 400.

The device 400 may further comprise a computer readable medium, e.g. in the form of a memory 420. The computer readable medium may comprise computer readable instructions 430 that, when executed on a processing device, such as the processor 410, cause the processing device to perform the method of the present disclosure, such as the method described in relation to FIG. 1 and FIGS. 3a-d. The computer readable instructions 430 may be included in a computer program. The device 400 may further be comprised in a mask writer system.

As indicated hereinabove, the inventor has realised that an edge sharpness and edge roughness of a printed pattern depends on the relative laser intensity of pixels at an edge or close to an edge of the pattern. In relation to this, the inventor has further realised that an edge can be enhanced in relation to edge sharpness and edge roughness by means of providing an "overdose" to edge pixels or neighbouring pixels.

A method of setting effective exposed laser dose of a plurality of pixels representing a lithographic exposure is described in the following. The plurality of pixels comprises at least one edge pixel arranged at an edge of an area of pixels to be exposed, at least one neighbouring pixel arranged one pixel away from the at least one edge pixel in a perpendicular direction away from the edge towards the area of pixels to be exposed, and a non-neighbouring pixel arranged at least two pixels away from the at least one edge pixel in the perpendicular direction away from the edge towards the area of pixels to be exposed. The method comprises setting a respective effective exposed laser dose of each pixel of the plurality of pixels such that a respective effective exposed laser dose of an edge pixel of the at least one edge pixel or of a neighbouring pixel of the at least one neighbouring pixel is higher than a respective effective exposed laser dose of the non-neighbouring pixel.

The non-neighbouring pixel is a pixel which is completely covered by a vector pattern data describing a pattern to be printed. Since the respective effective exposed laser dose of the edge pixel or of the neighbouring pixel is set higher than the respective effective exposed laser dose of the non-neighbouring pixel, the edge pixel or of the neighbouring pixel is provided an "overdose". The overdose may for example be achieved by means of the method 200 described in relation to FIG. 2 or in any other suitable way.

The above description of examples is to be regarded as non-limiting. While specific examples have been described, it will be apparent to those having ordinary skill within the art that various changes, modifications or alterations are conceivable within the scope as defined in the appended claims.

The invention claimed is:

1. A method for setting respective relative laser intensities to a plurality of pixels representing a lithographic exposure, wherein the plurality of pixels comprises at least one edge pixel arranged on an edge of an area of pixels to be exposed, and at least one neighbouring pixel, the at least one neighbouring pixel being arranged one pixel away from the at least one edge pixel in a perpendicular direction away from the edge towards the area of pixels to be exposed, the method comprising the steps of:

decreasing proportionally a relative laser intensity of each pixel of the plurality of pixels from a previously set respective first relative laser intensity to a respective second relative laser intensity, adjusting proportionally a laser dose translation of relative laser intensity of pixels from a previously set first laser dose translation to a second laser dose translation, such that a respective effective exposed laser dose of each pixel is achieved by the second laser dose translation of the respective second relative laser intensity which is equal to a respective effective exposed laser dose of each pixel that would have resulted from the first laser dose translation of the respective first relative laser intensity, and increasing, by a constant additive term, a respective relative laser intensity of an edge pixel of the at least one edge pixel or of a neighbouring pixel of the at least one neighbouring pixel from the respective second relative laser intensity to a respective third relative laser intensity.

2. The method according to claim 1, wherein the respective second relative laser intensity is equal to the respective first relative laser intensity multiplied by a factor less than one.

3. The method according to claim 1, wherein the respective third relative laser intensity is such that a respective effective exposed laser dose achieved by the second laser dose translation of the respective third relative laser intensity of the edge pixel of the at least one edge pixel or of the neighbouring pixel of the at least one neighbouring pixel is higher than a respective effective exposed laser dose achieved by the first laser dose translation of 100 percent relative laser intensity in respect to the respective first relative laser intensity.

4. The method according to claim 1, further comprising:
on condition that the respective relative laser intensity of the edge pixel of the at least one edge pixel corresponds to a relative laser intensity larger than a threshold, increasing, by the constant additive term, the respective second relative laser intensity of the edge pixel of the at least one edge pixel to the respective third relative laser intensity, and
on condition that the respective relative laser intensity of the edge pixel of the at least one edge pixel corresponds to a relative laser intensity less than the threshold, increasing, by the constant additive term, the respective second relative laser intensity of the neighbouring pixel of the at least one neighbouring pixel to the respective third relative laser intensity.

5. The method according to claim 1, wherein the respective first relative laser intensity corresponds to a respective percentage from 0 to 100 percent relative laser intensity.

6. The method according to claim 1, wherein the edge pixel is a pixel for which the respective first relative laser intensity is larger than 0 percent relative laser intensity, and that is adjacently arranged to at least one pixel for which the respective first relative laser intensity is 0 percent relative laser intensity.

7. The method according to claim 6, wherein the neighbouring pixel is a pixel for which the respective first relative laser intensity is larger than 0 percent relative laser intensity, and that is adjacently arranged to the edge pixel in a direction perpendicular from the edge.

8. A non-transitory computer readable medium comprising computer readable instructions that, when executed on a processing device, cause the processing device to perform the method according to claim 1.

9. A device for setting respective relative laser intensities to a plurality of pixels, wherein the plurality of pixels comprises at least one edge pixel, and at least one neighbouring pixel, wherein the at least one neighbouring pixel is arranged one pixel away from the at least one edge pixel in a perpendicular direction from an edge, the device comprising processing means configured to perform the method of claim 1.

10. A mask writer system comprising the device according to claim 9.

* * * * *